US012308145B2

(12) United States Patent
Kagerhuber et al.

(10) Patent No.: US 12,308,145 B2
(45) Date of Patent: May 20, 2025

(54) CONNECTION LINE FOR HIGH CURRENTS AND/OR VOLTAGES, TESTING DEVICE, AND METHOD FOR PRODUCING A COMPENSATION REGION

(71) Applicant: LISA DRAXLMAIER GMBH, Vilsbiburg (DE)

(72) Inventors: Manuel Kagerhuber, Gangkofen (DE); Linus Weberbeck, Vilsbiburg (DE)

(73) Assignee: Lisa Dräxlmaier GmbH, Vilsbiburg (DE)

( * ) Notice: Subject to any disclaimer, the term of this patent is extended or adjusted under 35 U.S.C. 154(b) by 692 days.

(21) Appl. No.: 17/602,764

(22) PCT Filed: Mar. 25, 2020

(86) PCT No.: PCT/EP2020/058333
§ 371 (c)(1),
(2) Date: May 3, 2022

(87) PCT Pub. No.: WO2020/207800
PCT Pub. Date: Oct. 15, 2020

(65) Prior Publication Data
US 2022/0262546 A1 Aug. 18, 2022

(30) Foreign Application Priority Data
Apr. 10, 2019 (DE) .......................... 102019109394.5

(51) Int. Cl.
*H01B 9/00* (2006.01)
*G01R 1/067* (2006.01)
(Continued)

(52) U.S. Cl.
CPC ......... *H01B 9/006* (2013.01); *G01R 1/06705* (2013.01); *H01B 7/04* (2013.01);
(Continued)

(58) Field of Classification Search
CPC ........ H01B 9/006; H01B 7/04; H01B 7/1805; H01B 13/0036; H01B 7/421; G01R 1/06705; H02G 11/00
See application file for complete search history.

(56) References Cited

U.S. PATENT DOCUMENTS 3,449,706 A * 6/1969 Carissimi ........... H01R 13/5227
174/67
3,726,988 A 4/1973 Davis
(Continued)

FOREIGN PATENT DOCUMENTS

CH 554059 4/1973
DE 10361433 A1 * 7/2005 ............. H01B 9/003
(Continued)

OTHER PUBLICATIONS

Litz wire, available at https://en.wikipedia.org/wiki/Litz_wire on Apr. 1, 2019 (Year: 2019).*
(Continued)

*Primary Examiner* — Daniel R Miller
(74) *Attorney, Agent, or Firm* — BelayIP

(57) ABSTRACT

The present disclosure describes a connection line for high currents and voltages, the connection line having an electrically conductive strand bundle enclosed by an electrically insulating cable sheath, and at least one compensation region for compensating angle tolerances, position tolerances and relative movements between two portions of the connection line. The cable sheath may be interrupted in the compensation region. The strand bundle may be widened in a spindle-like manner to form at least three arcuate strands.

14 Claims, 2 Drawing Sheets

(51) Int. Cl.
  *H01B 7/04* (2006.01)
  *H01B 7/18* (2006.01)
  *H01B 13/00* (2006.01)
  *H01B 7/42* (2006.01)

(52) U.S. Cl.
  CPC ....... *H01B 7/1805* (2013.01); *H01B 13/0036* (2013.01); *H01B 7/421* (2013.01)

(56) References Cited

U.S. PATENT DOCUMENTS

| | | | | |
|---|---|---|---|---|
| 5,399,808 | A * | 3/1995 | Carter | H01R 13/6592 174/DIG. 8 |
| 2003/0132773 | A1 * | 7/2003 | Brkovic | G01R 1/06772 324/754.13 |
| 2006/0081388 | A1 * | 4/2006 | Spath | H01B 9/006 174/27 |
| 2016/0276063 | A1 | 9/2016 | Mizuno et al. | |
| 2017/0271046 | A1 * | 9/2017 | Parke | G02B 6/4482 |
| 2018/0166185 | A1 * | 6/2018 | Fleischer | H01B 7/282 |
| 2020/0243996 | A1 * | 7/2020 | Wittmann | H01R 13/533 |

FOREIGN PATENT DOCUMENTS

| | | |
|---|---|---|
| DE | 202004016182 U1 | 4/2006 |
| DE | 102013012163 A1 | 1/2015 |
| DE | 102014220243 A1 | 4/2015 |
| EP | 0007546 A1 | 7/1979 |
| JP | 2001-216848 | 8/2001 |

OTHER PUBLICATIONS

DE102013012163A1 English language translation, Jan. 22, 2015.
CH554059 English language translation, Apr. 6, 1973.
DE102014220243A1 English language translation, Apr. 23, 2015.
EP0007546A1 English language translation, Jul. 16, 1979.
DE202004016182U1 English language translation, Apr. 27, 2006.
JP2001-216848 English language translation, Aug. 10, 2001.
German Patent Office Examination of DE102019109394.5 in German, Jan. 15, 2020.
German Patent Office Examination of DE102019109394.5 in English, Jan. 15, 2020.

* cited by examiner

CONNECTION LINE FOR HIGH CURRENTS AND/OR VOLTAGES, TESTING DEVICE, AND METHOD FOR PRODUCING A COMPENSATION REGION

CROSS REFERENCE TO RELATED APPLICATIONS

This application is a national phase application of International Application No. PCT/EP2020/058333, filed 25 Mar. 2020, and claims priority to German Patent Application 102019109394.5 filed on Apr. 10, 2019, the content of both of which is hereby incorporated herein by reference.

BACKGROUND OF THE INVENTION

The present disclosure relates to a connecting lead for high currents and/or voltages, a test device comprising such a connecting lead, and a method for producing a compensation range for compensating angular tolerances, positional tolerances, as well as relative movements between two sections of such a connection line.

A connecting lead for high currents and/or voltages has a large conductor cross-section in order to be able to transmit the high electrical currents. Further, the connecting lead has a sheath that is thick enough to safely insulate the high voltage. Due to the large conductor cross-section and the thickness of the insulation, the connecting lead is also very stiff. Additionally, a connecting lead with an electrical conductor in strand form has a high bending resistance.

To compensate for angular tolerances, positional tolerances and relative movements between two sections of the connecting cable, the connecting cable can be laid in loops or bays in order to reduce any necessary bending of the connecting cable to a great length to distribute.

BRIEF SUMMARY OF THE INVENTION

It is therefore an object of the present disclosure, using means which are as simple as possible in construction, to provide a connecting lead for high currents and/or voltages, a test device with such a connecting line or connecting cable and a method for producing a compensating area for the tolerances, positional tolerances and relative movements between two sub-regions of such a connecting line.

A connection line for high currents and/or voltages is presented, wherein the connecting line has an electrically conductive strand packet enclosed by an electrically insulating cable sheath and, if appropriate, electromagnetic shielding means, and at least one compensation region or area for compensating for angular tolerances, positional tolerances and relative movements between two subregions of the connecting line, wherein the cable sheathing and the shielding are interrupted in the compensation area and the cable sheath and the shield are interrupted in the compensation area and the cable bundle is expanded in a spindle shape to form at least three arcuate strands.

Furthermore, a test fixture for testing high voltage components using high currents and voltages is presented, wherein the test fixture comprises an electrical contact element movably mounted on a bearing device for contacting the high contacting high-voltage components and test electronics for providing the high currents and/or voltages, wherein at least one connecting lead for high currents and/or voltages with a compensating range according to the approach presented here connects the contact element in an electrically conductive manner to the test electronics and for this purpose connects the contact element to the test electronics in an electrically conductive manner which is designed to compensate for angular tolerances, positional tolerances and relative movements between the contact element and the bearing device contact element and the bearing device.

Furthermore, a method for producing a compensation area for compensating angular tolerances, positional tolerances, and relative movements between two partial areas of a connecting line for high currents and/or voltages is set out, wherein an electrically insulating cable sheath of the connecting line is interrupted between the sub-regions, and an electrically conductive strand package is presented to at least three is widened in the shape of a spindle in arcuate strands.

A connecting lead for high currents and/or voltages is designed to safely transmit an electrical voltage between 300 V and 5000 V. An insulation of the connection line has an electrical dielectric strength adapted to the high voltages. The connecting cable has a conductor cross-section which is dimensioned to transmit an electrical drive power, an electrical charging power, and an electrical portion of a braking power of an at least partially electrically driven vehicle on the high voltage.

An electrical conductor of the connecting line can be in the form of a string package consisting of at least three strands. The strands are not insulated from each other. The insulation may be provided by a common cable sheath of all strands of the strand package. The cable jacket may be multi-layered. Within the cable jacket, the strands may be in direct contact with each other without substantial gaps. The bundle of strands may be insulated by a shield against electromagnetic interference and radiation must be shielded.

A compensation area may have a substantially lower bending, shearing, and crushing resistance than adjacent areas of the connecting cable with the insulating cable sheath. In the compensation area, the cable sheath may be removed. The cable sheath may also be manufactured with an interruption corresponding to the compensation area. The interruption may be produced, for example, by briefly suspending an extrusion of the cable sheath while the strand package continues to be drawn from the extruder. The interruption may also be produced by, for example, mechanical, chemical, or thermal removal of the cable sheath.

The strands of the strand package can be continuous over the compensation area. In the compensation area, the strands may be curved in different spatial directions away from a central axis of the connection line. The strands may together have a bulb shape or spindle shape in the equalization region. In the compensation area, the strands can be spaced apart from each other.

There may be gaps between the strands in the compensation area. The strands can converge at the edges of the compensation area to form the closed strand package. Any shielding of the connecting cable may also be interrupted in the compensation area.

In a test device, the connection line can be used between a test electronics of the test device and a contact element or a test head of the test device. The contact element may, for example, comprise movably mounted spring contact pins and/or mating connectors. The compensation area then allows rotary movements and linear movements of the contact element relative to the bearing device within a range of movement of the compensation range. The range of motion depends on a length of the compensation range. The mobility of the contact element can be achieved, for example, by a resilient suspension, with or without selfcentering, or a floating suspension bearing, each with one or more degrees of freedom in a defined range.

The bundle of strands may be untwisted in the compensation region opposite a lay direction of the bundle of strands. Within the cable sheath, the strands can be twisted to the strand package and may be twisted in a lay direction. The portions of the connecting lead adjacent to the compensating portion may be twisted against each other to assist in forming the spindle shape. Due to the untwisting, the Arc shape of the strands arise.

The strand stack may be axially compressed in the compensation area. The arcuate strands may have a greater length than the compensation area. To create the compensation area, the edges of the compensation area may be moved towards each other. A cavity may be formed in an interior space between the strands.

The compensation region may have a length that is significantly shorter than a length of the connecting lead. For example, the compensation region may have a length that is less than 10 times, less than 5 times, or even less than 2 times a diameter of the connecting lead. Further, the equalizing region may have an expanded maximum diameter that is significantly greater, in particular by areas adjacent to the compensation area.

The strand package may be compressed by a compression factor between ⅙ and ½. The compression factor can represent a relationship between an uncompressed length of the compensation range and a compressed length of the compensation range.

The strands may be individually insulated in the compensation area. For example, a liquid insulating layer may be applied to the strands and may crosslink on the strands.

The strands can be coated with the insulating layer, for example, by dipping or spray coating. Compared to the insulation outside the compensation area, the insulating layer in the area of the compensation area can have the same or a different, in particular a smaller, layer thickness and/or be made of the same or a different material.

The strands may be stranded wires with a plurality of wires. The strands can be twisted. The strands may be twisted in the direction of lay, or in the same lay, or twisted against the direction of lay, or in the opposite lay. The compensation area can be particularly effective when the strands are twisted against the direction of lay, since the spindle-shaped expansion of the strand package eliminates the mechanical interlocking of the strands such that the mechanical interlocking of the strands with one another is eliminated.

The compensation area may be enclosed by an electrically insulating elastic sheath. The sheath may have a larger inner diameter than an outer diameter of the compensation area. The envelope can follow the compensating movements by elastic deformations. This envelope may contain an elastic electromagnetic shield. This may, for example, be constructed from wound foil or wire mesh.

The elastic sleeve may be in the form of a bellows. A bellows may have a particularly low bending resistance and little or no hindrance to the compensating movements.

The string package can have between 3 and 30 strings. The approach presented here works for all connection lines with three or more strands, since no preferred bending direction of the compensation area is formed for three strands or more.

The string package can have a line cross-section smaller than 100 cm². Above 100 cm², a bending resistance of the compensation area may be too large.

The strands may each have a strand cross-section between 1 mm² and 50 mm². In this range, the individual strand exhibits an advantageous bending resistance and can be formed into an arc shape with little effort.

BRIEF DESCRIPTION OF THE SEVERAL VIEWS OF THE DRAWINGS

The above and other aspects of the present disclosure will become more apparent by describing exemplary embodiments in detail below with reference to the accompanying drawings, wherein.

The figures are merely schematic representations and serve only to explain the invention. Identical or similarly acting elements are provided throughout with the same reference signs.

DETAILED DESCRIPTION OF THE SEVERAL VIEWS OF THE DRAWINGS

As used throughout the present disclosure, unless specifically stated otherwise, the term "or" encompasses all possible combinations, except where infeasible. For example, the expression "A or B" shall mean A alone, B alone, or A and B together. If it is stated that a component includes "A, B, or C" then, unless specifically stated otherwise or infeasible, the component may include A, or B, or C, or A and B, or A and C, or B and C, or A and B and C. Expressions such as "at least one of" do not necessarily modify an entirety of a following list and do not necessarily modify each member of the list, such that "at least one of A, B, and C" should be understood as including only one of A, only one of B, only one of C, or any combination of A, B, and C.

Figure 1:
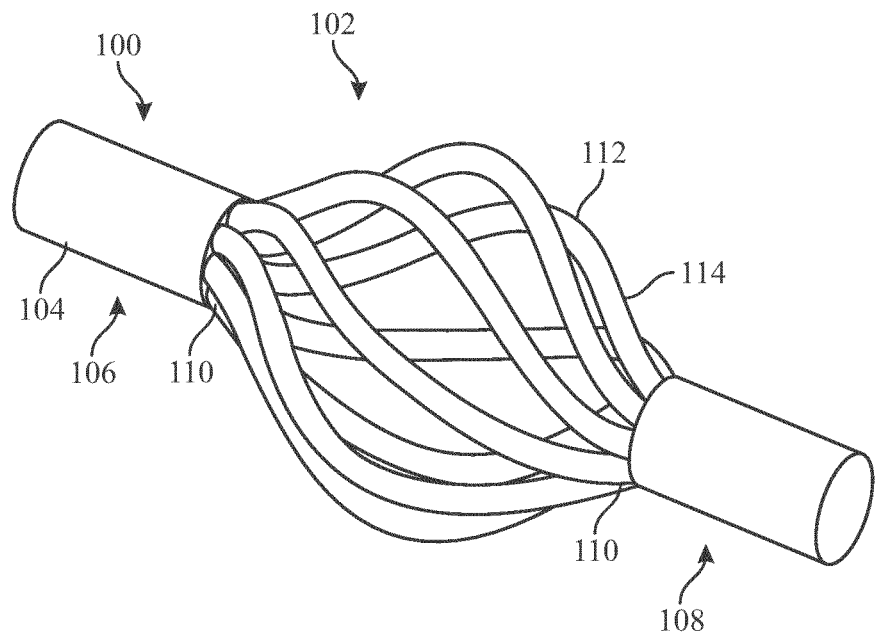
FIG. 1 depicts an illustration of a connection line with a compensation area according to an embodiment of the present disclosure.

FIG. 1 shows an illustration of a connection line 100 having a compensation area 102, according to an example embodiment. The connection line 100 is designed to compensate for high transmitted currents and/or voltages. The connection line 100 can also be used as a high voltage cable. A cable sheath 104 of the connection line 100 is missing in the compensation area 102. In sections or subregions 106, 108 of the connecting cable 100 adjacent to the compensation area 102, an electrical conductor of the connecting cable 100 is enclosed and electrically insulated by the cable sheath 104. The electrical conductor is formed as a bundle of strands 110 comprising eight similar electrically conductive strands 112. In the compensation area 102, the strands 112 are curved laterally and are spaced apart from adjacent strands 112, whereby the strand package 110 has an overall spindle shape. In this regard, the strands 112 of the strand package 110 enclose an interior cavity in the compensation area 102.

As a result of the strands 112 not being adjacent to each other in the compensation area 102, and bent laterally, the connecting lead 100 has a substantially reduced bending resistance, compression resistance and tensile resistance in the compensation area 102 compared to the insulated subareas 106, 108. Thus, the connecting lead 100 can be bent in the compensation area 102, with little force, within a tolerance range, and shortened or lengthened.

Figure 2:
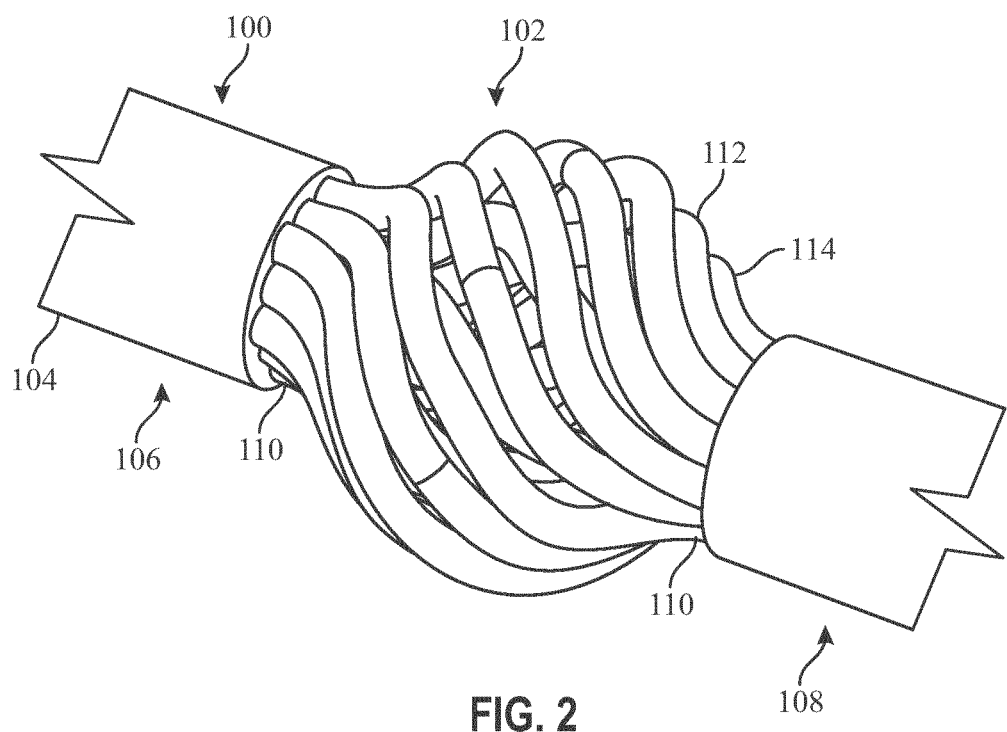
FIG. 2 depicts an illustration of a thick connecting line according to an embodiment of the present disclosure.

In one embodiment, the strands 112 in the compensation area 102 are individually electrically insulated by an insulating layer 114. FIG. 2 shows an illustration of a thick connecting line 100 according to an example embodiment. The connection line 100 corresponds essentially to the connection line in FIG. 1. In contrast, the connection line 100 shown here has a substantially larger line cross-section. For this purpose, the string package 110 has substantially more individual strands 112. The strands are also thicker than the strands in FIG. 1, where the strand package 110 has 18 strands (112).

A test fixture for testing high voltage components using high currents and voltages is depicted in FIG. 1. The depicted test fixture 200 includes an electrical contact element 202 movably mounted, by means known to the skilled person, on a bearing device 204. The electrical contact element is configured and arranged to contact high-voltage components 206 and/or test electronics 208 (depicted in the "and" of the "and/or" with the "or" arrangement being a matter of design choice) and provide them with high currents and/or voltages. In an embodiment, at least one connecting lead for high currents and/or voltages with a compensating range according to the approach presented here connects the contact element in an electrically conductive manner to the test electronics. For this purpose it connects the contact element to the test electronics in an electrically conductive manner which is designed to compensate for angular tolerances, positional tolerances and relative movements between the contact element and the bearing device contact element and the bearing device.

Figure 3:
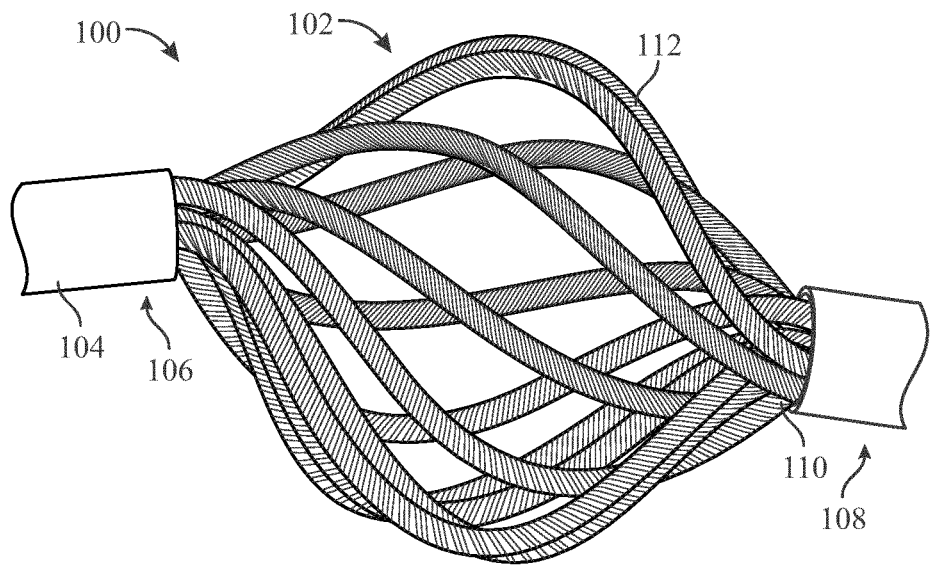
FIG. 3 depicts a representation of an angularly offset connecting line according to an embodiment of the present disclosure.

FIG. 3 depicts an illustration of an angularly offset connecting line 100 according to an example embodiment. The connection line 100 corresponds essentially to the connection lines shown in FIGS. 1 and 2. Here, the strand package 110 has 12 strands (112). In addition, the strands 112 are stranded wires. The strands comprise many individual thin wires and are more flexible than a single wire with the same conductor cross-section.

Figure 4:
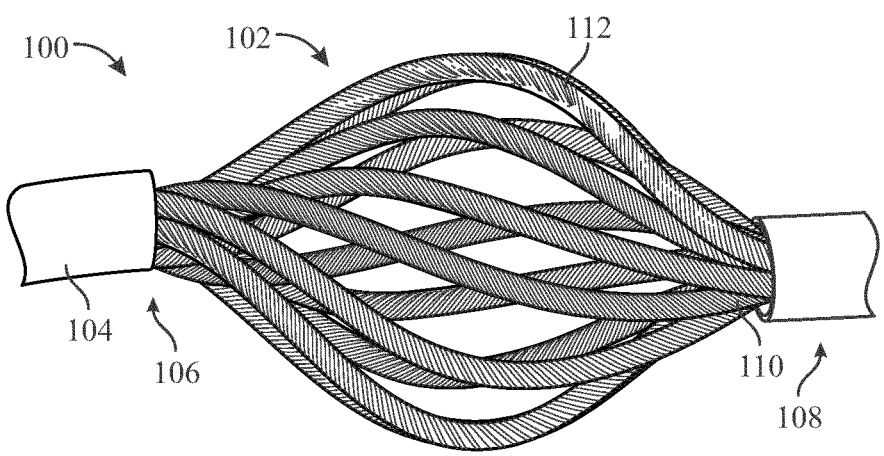
FIG. 4 depicts a laterally offset connection line according to an embodiment of the present disclosure.

The sub-regions 106, 108 have an angular offset and a lateral offset from each other. The compensation area 102 is thus asymmetrically deformed but can compensate for the angular offset and lateral offset without problems. The compensation area can be bent by up to 30°. For example, FIG. 4 depicts an illustration of a laterally offset connection line 100 according to an example embodiment. The connection line 100 is substantially the same as the connection line in FIG. 3. Here, the sub-regions 106, 108 are laterally offset from each other without angular offset. The compensation area 102 can have a lateral offset of up to three times the diameter of the high-voltage line 100 without difficulty.

In other words, a compensating element for electrical connections is presented. The approach presented here is used to determine mechanical tensions in electrical connections that occur due to the stiffness of the conductors which should be avoided. Especially in test fixtures for high currents, contact parts with high tolerances are used. For this purpose, the contact elements are mounted elastically or floating in the test fixture housing. Due to the partially direction-dependent stiffness of the connecting leads for high currents, the mobility of the contact element can be and may be restricted and tensions may occur, which may impair the contact with the stop part. The approach presented herein allows freer movement of the contact elements. This freer movement of the two ends of the compensating element relative to each other can also reduce distortions due to thermal expansion especially at high currents, by elastically absorbing the displacement.

In order to establish the compensation area 102, a cable may be connected thereto. For the present current, the insulation is carefully stripped and the cable is then bulb-shaped by partially untwisting and upsetting it to form an onion shape. As a result, the individual strands no longer touch in the area of the belly and the cable becomes much softer in this area against radial and axial displacements, as well as against bending and torsion. Due to the (radially) symmetrical construction, the directional dependence of the restoring forces becomes minimized.

(Highly) flexible cables, which come up against natural limits with the cross-sections required for high currents and limited installation space, can alternatively also be laid in loops or with sag. In a test fixture, however, this is not possible for reasons of space. Loosely braided flat ribbon cables can also be used in high-current test adapters. Flat ribbon cables can be used in high-current test adapters, but these are stiffer than what would be required for problem-free mobility of the contact elements. In addition, their stiffness is strongly directionally dependent.

In the case of busbars, busbars assembled from thin copper sheets may be welded locally so as to be defined by the dissolution of the bond, in order to create highly elastic areas. At best, planar degrees of freedom can be achieved. In the "width direction", a sheet is always flexurally rigid.

A thick (and thus stiff) cable can also be replaced by several thinner cables arranged at a distance from each other. However, this is very complex in design due to the many required connection points. The approach presented here improves the possibility to produce products from and for the high current range (e.g., BJBs) in a process-safe manner, and can thus help to avoid time-consuming factory interventions and repetitive testing. The compressed compensation area 102 can be equipped with appropriate shielding and insulation.

The approach presented here enables the process-reliable contacting of DUTs with coarse tolerances in the contact position. This is also possible with limited installation space. The approach presented here enables the mobility of movably mounted electrical contact parts even with large conductor cross-sections in a large range and with low restoring forces. The restoring forces behave radially symmetrically, which enables uniform mobility in all directions. This facilitates and ensures reliable contacting of test pieces with different position and angle deviations of the contact parts, especially for test contacts.

This wide-ranging and uniform mobility is not only advantageous in the field of test engineering but can be used everywhere where relative movements between electrically connected parts is desired and/or should be made possible.

As a useful side effect, the outer surface of the cable is enlarged by the bulking of the conductor strands. Provided that no wide insulation (e.g., in the form of a bellow) is provided, a significantly improved heat dissipation can be achieved. Since the cable insulation is opened anyway, access for measurement sensors of all kinds (e.g., voltage, temperature) is facilitated. A four-pole measurement and/or Kelvin measurement is also possible at this point.

The bulging results in a locally reduced stiffness, due to the bending radius of the cable which can be greatly reduced. When making a compensation area 102, insulation(s) and, if present, shielding may be carefully removed (e.g., with a knife) from a cable having the required cross-section over a length of a few cm without removing or damaging any cores. Then the exposed part of the cable is compressed and twisted against the direction of impact until the individual strands/card elements stand out from each other. The cable is further compressed until a plastic deformation of the conductors occurs into the desired onion shape. To form the onion shape, individual strands can be slightly straightened if necessary, in order to achieve an even distribution of the conductors.

Since the devices and methods described in detail above are examples of embodiments, they may be used in a customary manner by the skilled person in a wide extent can be modified without leaving the scope of the invention. In particular, the mechanical arrangements and the size ratios of the individual elements to one another are selected merely by way of example.

Having described aspects of the present disclosure in detail, it will be apparent that further modifications and variations are possible without departing from the scope of the present disclosure. All matter contained in the above description and shown in the accompanying drawings shall be interpreted as illustrative and not in a limited sense.

The invention claimed is:

1. A connection line configured to transmit high currents and/or voltages, the connection line including at least two subregions regions and comprising:
   an electrically insulated cable sheath;
   a strand package;
   at least one compensating area defined by an interruption in the electrically insulated cable sheath, the at least one compensating area configured and arranged to compensate for:
      angular tolerances, positional tolerances and relative movements between the two subregions; and
      angular tolerances, positional tolerances and relative movements between the two subregions; and
   wherein the strand package arranged in the at least one compensating area comprises at least three arcuate strands arranged expanded away from one another in a spindle shape;
   wherein the strand package is configured to be axially compressed in the at least one compensating area, and
   wherein the strand package is arrange d according to a compression factor between $1/6$ and $1/2$, the compression factor representing a relationship bet ween an uncompressed length of a compensation range and a compressed length of the compensation range.

2. The connection line according to claim 1, wherein the at least three arcuate strands of the strand package are untwisted in the at least one compensating area opposite to a lay direction of the strand package.

3. The connection line according to claim 1, wherein each of the at least three arcuate strands are individually insulated in the at least one compensating area.

4. The connection line according to claim 1, wherein each of the at least three arcuate strands comprise a plurality of wires.

5. The connecting line according to claim 1, wherein the at least one compensating area comprises an electrically insulating resilient sheath.

6. The connection line according to claim 5, wherein the electrically insulating resilient sheath is elastic and comprises a bellows shape.

7. The connection line according to claim 1, wherein the strand package comprises between 3 and 30 strands.

8. The connection line according to claim 1, wherein the strand package comprises a line cross-section that is less than 100 $cm^2$.

9. The connecting line according to claim 1, wherein each of the at least three arcuate strands comprise a cross-section between 1 $mm^2$ and 50 $mm^2$.

10. A testing device for testing high voltage components using high currents and voltages, the testing device comprising:
    an electrical contact element movably mounted on a bearing device for contacting the high-voltage components;
    test electronics configured to provide the high currents and/or voltages;
    at least one connecting lead for high currents and/or voltages comprising an electrically insulated cable sheath and at least one compensating area arranged between two subregions of the at least one connecting lead, the at least one compensating area configured to compensate for:
       angular tolerances, positional tolerances and relative movements between the two subregions, and
       angular tolerances, positional tolerances and relative movements between the two subregions, and
    wherein the at least one compensating area is defined by an interruption in the cable sheath;
    wherein the at least one compensating area comprises a strand package including at least three arcuate strands configured and arranged to expand away from one another in a spindle shape; and
    wherein the at least one connecting lead is arranged to electrically and conductively connect the contact element to the test electronics so as to test electronics and the at least one connecting lead is designed to compensate for angular tolerances, positional tolerances and relative movements between the contact element and the bearing device; and
    wherein the strand package is configured to be axially compressed in the at least one compensating area; and
    wherein the strand package is arranged according to a compression factor of between $1/6$ and $1/2$, the compression factor representing a relationship between an uncompressed length of a compensation range and a compressed length of the compensation range.

11. A method for producing a compensating area of a connecting line, the compensating area configured to compensate for angular tolerances, positional tolerances and relative movements between two subregions of the connecting line, the connecting line configured to transmit high currents and/or voltages, the method comprising the steps of:
    interrupting an electrically insulating cable sheath of the connecting line between the two subregions so as to define the compensating area therebetween;
    expanding at least three arcuate strands of an electrically conductive strand package arranged in the compensating area in the form of a spindle;
    configuring the strand package to axially compress in the compensating area; and
    arranging the strand package according to a compression factor of between $1/6$ and $1/2$, the compression factor representing a relationship between an uncompressed length of a compensation range and a compressed length of the compensation range.

12. The method according to claim 11, further comprising the steps of untwisting the at least three arcuate strands opposite to a lay direction of the strand package.

13. The method according to claim 11, further comprising the steps of:
- insulating each of the at least three arcuate strands; and
- arranging 3 to 30 strands in the strand package, each of the 3 to 30 strands comprising a plurality of wires.

14. The method according to claim 11, wherein the strand package comprises a line cross-section that is less than 100 cm$^2$ and each of the at least three arcuate strands comprise a cross-section between 1 mm$^2$ and 50 mm$^2$.

\* \* \* \* \*